(12) United States Patent
Tezuka et al.

(10) Patent No.: US 7,005,676 B2
(45) Date of Patent: Feb. 28, 2006

(54) SEMICONDUCTOR DEVICE MANUFACTURING METHOD

(75) Inventors: Tsutomu Tezuka, Yokohama (JP); Shinichi Takagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 10/628,513

(22) Filed: Jul. 29, 2003

(65) Prior Publication Data
US 2005/0260809 A1     Nov. 24, 2005

(30) Foreign Application Priority Data
Jul. 29, 2002 (JP) ............................. 2002-220030

(51) Int. Cl.
H01L 29/04 (2006.01)
H01L 29/12 (2006.01)
H01L 29/76 (2006.01)
H01L 31/036 (2006.01)

(52) U.S. Cl. ........................... 257/65; 257/66; 257/64; 257/63; 257/51

(58) Field of Classification Search ................. 257/51, 257/52, 55, 63, 64, 65, 66, 67, 69, 200; 438/166, 438/168, 187, 486
See application file for complete search history.

(56) References Cited

U.S. PATENT DOCUMENTS

| | | | | |
|---|---|---|---|---|
| 5,998,807 A | * | 12/1999 | Lustig et al. | 257/66 |
| 6,197,626 B1 | * | 3/2001 | Yamazaki et al. | 438/159 |
| 6,232,622 B1 | * | 5/2001 | Hamada | 257/67 |
| 6,518,104 B1 | * | 2/2003 | Maekawa et al. | 438/151 |
| 6,528,399 B1 | * | 3/2003 | Alieu et al. | 438/561 |

OTHER PUBLICATIONS

T. Tezuka et al., "Dislocation-free formation of relaxed SiGe-on-insulator layers", American Institute of Physics, Applied Physics Letters, vol. 80, No. 19, May 13, 2002, pp. 3560-3562.
T. Tezuka et al., "Dislocation-free formation of relaxed SiGe-on-insulator layers", American Institute of Physics, (May 13, 2002).
T. Tezuka et al., "Integrated Circuit Device", U.S. Appl. No. 10/188,824, filed Jul. 5, 2002.
A. Nishida et al., "Elimination of misfit dislocations in $Si_{1-x}Ge_x$/Si heterostructures by limited-area molecular-beam epitaxial growth", J. Appl. Phys. vol. 71 (12), Jun. 15, 1992.
T. Mizuno et al., "High Performance Strained-Si p-MOSFETs on SiGe-on-Insulator Substrates Fabricated by SIMOX Technology", IEDM Technical Digest, pp. 934-936 (1999).
T. Tezuka et al., "Fabrication of strained Si on an ultrathin SiGe-on-insulator virtual substrate with a high Ge fraction", Applied Physics Letters, 79, pp. 1798-1800 (2001).
F. Y. Huang et al., "High-quality strain-relaxed SiGe alloy grown on implanted silicon-on-insulator substrate", Applied Physics Letters, 76, pp. 2680-2682 (2000).

* cited by examiner

*Primary Examiner*—Nathan J. Flynn
*Assistant Examiner*—Victor A. Mandala, Jr.
(74) *Attorney, Agent, or Firm*—Finnegan, Henderson, Farabow, Garrett & Dunner, L.L.P.

(57) ABSTRACT

There is here disclosed a semiconductor device manufacturing method comprising a step of forming an island region including a monocrystalline $Si_{1-x-y}Ge_xC_y$ layer ($1>x>0$, $1>y\geq 0$) and a peripheral region including an amorphous or polycrystalline $Si_{1-x-y}Ge_xC_y$ layer which surrounds the island region on a monocrystalline Si layer on an insulating film, a step of subjecting the respective $Si_{1-x-y}Ge_xC_y$ layers to heat treatment, and after the heat treatment and the removal of a surface oxide film, a step of forming a monocrystalline $Si_{1-z-w}Ge_zC_w$ layer ($1>z\geq 0$, $1>w\geq 0$) which becomes an element formation region on the island region.

24 Claims, 5 Drawing Sheets

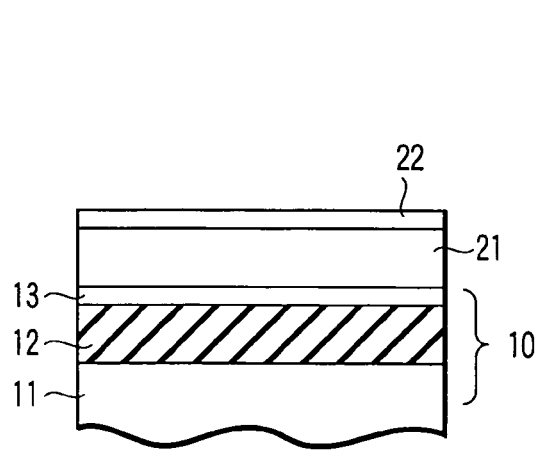
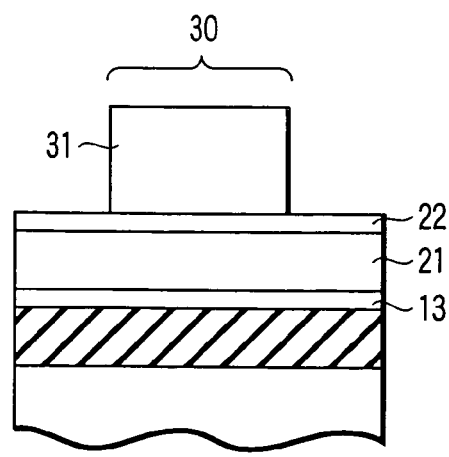
FIG. 1A  FIG. 1B
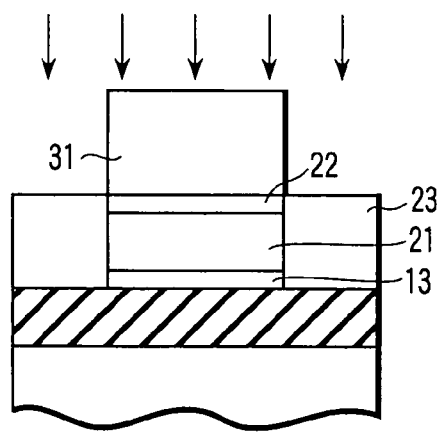
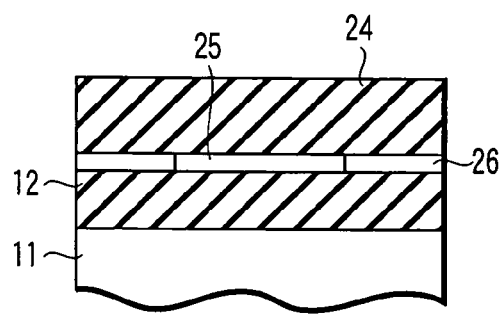
FIG. 1C  FIG. 1D
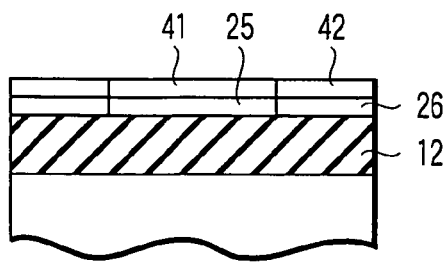
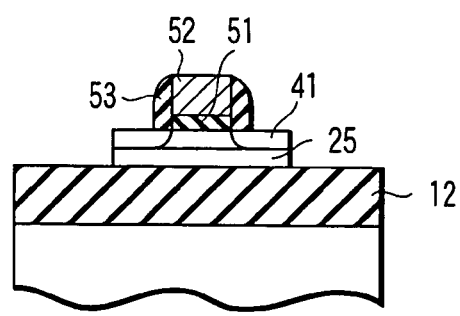
FIG. 1E  FIG. 1F

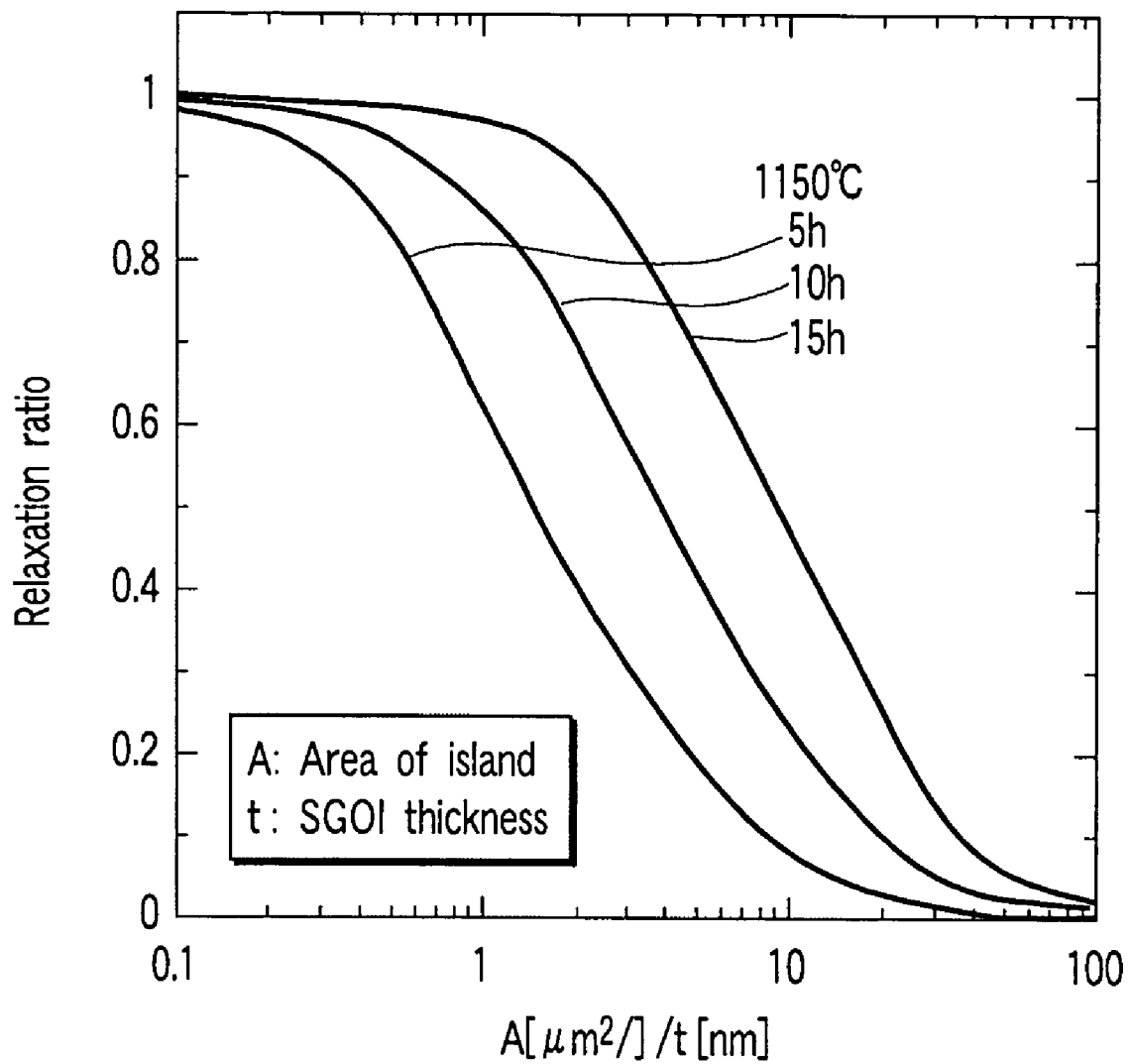
F I G. 7

SEMICONDUCTOR DEVICE MANUFACTURING METHOD

CROSS-REFERENCE TO RELATED APPLICATIONS

This application is based upon and claims the benefit of priority from the prior Japanese Patent Application No. 2002-220030, filed Jul. 29, 2002; the entire contents of which are incorporated herein by reference.

BACKGROUND OF THE INVENTION

1. Field of the Invention

The present invention relates to a semiconductor device manufacturing method for use in an integrated circuit, and more particularly to a semiconductor device manufacturing method for manufacturing a high-speed, low power consumption CMOS logic circuit element, an analog RF circuit element or the like including a strained Si and SiGe channel MOSFET.

2. Description of the Related Art

In recent years, the technical and economic barriers have become great to shorten a gate length of a field effect transistor (MOSFET). To relax this situation, a technology which uses a high-mobility channel material, especially strained Si (or strained SiGe) has attracted attention. Since the strained Si is formed on a lattice-relaxed SiGe wit a larger lattice constant, mobilities of both of electrons and holes increase by in-plane tensile strain. The strain amount of the strained Si becomes large as a Ge composition in a substrate SiGe becomes large, and hence the mobility becomes higher. If a CMOS includes a MOSFET having the strained Si channel, an operation higher than a Si-CMOS with the same size can be expected.

The present inventors have presented a MOSFET (strained SOI-MOSFET) in which the strained Si is combined with an Si-On-Insulator (SOI) structure, and substantiated its operation (T. Mizuno, S. Takagi, N. Sugiyama, J. Koga, T. Tezuka, K. Usuda, T. Hatakeyama, A. Kurobe, and A. Toriumi, IEDM Technical Digest, p. 934 (1999)).

This element is formed by sequentially stacking an buried oxide film, a lattice-relaxed SiGe buffer layer, a strained Si channel, a gate oxide film and a gate electrode film on a Si substrate. This structure has some advantages due to high carrier mobility of the strained Si, and a merit due to the SOI structure, such as a capability of reducing junction capacitance and a capability of downsize while maintaining a low impurity concentration. Therefore, if a CMOS logic circuit includes this structure, a higher speed and lower power consumption operation becomes possible.

In order to put the aforementioned element to practical use, a nearly completely lattice-relaxed $Si_{1-x}Ge_x$ buffer layer of a low dislocation density is necessary. Usually, the lattice constant of the SiGe thin film, which is grown with epitaxial growth on the Si substrate, parallel to the substrate coincides with that of the Si and only the lattice constant thereof vertical to the substrate is larger than that of the Si. That is, the SiGe thin film is strained SiGe layer having the compressive strain in the substrate surface. Even if the Si is grown with epitaxial growth on the compressively strained SiGe layer, the strain is not introduced into the Si layer. Therefore, to obtain the SiGe buffer layer for growing strained Si layer with epitaxial growth, it is necessary to lattice-relax the strained SiGe layer by some means. As a method for obtaining such a buffer layer, the present inventors have presented a method which thermally oxidizes an SiGe layer of a low Ge composition (x=0.1) formed on an oxide film at a high temperature to simultaneously achieve lattice relax and film thinning while increasing the Ge composition (x>0.5) (oxidation condensation) (Jpn. Pat. Appln. KOKAI Publication No. 2002-76347). An SiGe thin film grown with epitaxial growth on the SOI can also be subjected to oxidation condensation (T. Tezuka et al, Appl. Phys. Lett. 79, p 1798 (2001)).

In order to obtain high mobility by sufficiently straining the Si channel layer, the substrate SiGe layer must be sufficiently lattice-relaxed. On the other hand, in order to obtain reliability and reduce a leakage current, occurrence of lattice defects such as dislocation must be suppressed. However, in the conventional oxidation condensation, there has been a difficulty of lowering a threading dislocation density to a value of about $10^3$ cm$^{-2}$, which becomes a practical target, while sufficiently relaxing a lattice.

On the other hand, to promote the relaxation of the SiGe layer on the SOI, a method, which implants B (boron) ions into the buried oxide film and is annealed, has been presented (F. Y. Huang et al., Appl. Phys. Lett. Vol. 19, pp. 2680–2682 (2000)). According to this method, since the mixing of B in the oxide film greatly lowers a softening temperature of the oxide film, there is a possibility of obtaining a high relaxation rate even at an annealing temperature of about 800° C. without introducing dislocation. However, because of its very large diffusion coefficient at the oxidation temperature, B is easily diffused in the Si layer or the SiGe layer on the oxide film during the annealing process. B becomes p type impurities for Si. Thus, all the semiconductor layers on an insulating film are doped to be p types with high concentrations, which make manufacturing of a CMOS extremely difficult.

As described above, to put the strain SOI-MOSFET to practical use, the sufficiently lattice-relaxed SiGe buffer layer with the low dislocation density is required. However, it is difficult to form the lattice-relaxed SiGe thin film on the insulating film without introducing dislocation and impurity diffusion.

BRIEF SUMMARY OF THE INVENTION

According to an aspect of the present invention, there is provided a semiconductor device manufacturing method, which can form a lattice-relaxed SiGe thin film on an insulating film suitable to manufacturing of a strained Si-CMOS, and contribute to realization of a high-speed and low power consumption CMOS device.

A semiconductor device manufacturing method according to a first aspect of the present invention is characterized by comprising: forming an island region including a monocrystalline $Si_{1-x-y}Ge_xC_y$ layer ($1>x>0$, $1>y\geq0$) and a peripheral region including an amorphous or polycrystalline $Si_{1-x-y}Ge_xC_y$ layer which surrounds the island region on a monocrystalline Si layer on an insulating film; subjecting the respective $Si_{1-x-y}Ge_xC_y$ layers to heat treatment; and forming a monocrystalline $Si_{1-z-w}Ge_zC_w$ layer ($1>z\geq0$, $1>w\geq0$), which becomes an device formation region, on the island region after the heat treatment and removal of a surface oxide film.

A semiconductor device manufacturing method according to a second aspect of the present invention is characterized by comprising: forming a monocrystalline $Si_{1-x-y}Ge_xC_y$ layer ($1>x>0$, $1>y\geq 0$) on a monocrystalline Si layer on an insulating film; forming an island-shaped mask layer on the $Si_{1-x-y}Ge_xC_y$ layer; making a peripheral region amorphous by ion implantation excluding an island region of the $Si_{1-x-y}Ge_xC_y$ layer covered with the island-shaped mask layer; subjecting the $Si_{1-x-y}Ge_xC_y$ layer to heat treatment; and forming a monocrystalline $Si_{1-z-w}Ge_zC_w$ layer ($1>z\geq0$, $1>w\geq0$), which becomes an device formation region, on the island region of the $Si_{1-x-y}Ge_xC_y$ layer after the heat treatment and removal of a surface oxide film.

A semiconductor device manufacturing method according to a third aspect of the present invention is characterized by comprising: forming a first region including a monocrystalline $Si_{1-x-y}Ge_xC_y$ layer ($1>x>0$, $1>y\geq0$) on a monocrystalline Si layer on an insulating film and a second region including a slit or hole-shaped amorphous or polycrystalline $Si_{1-x-y}Ge_xC_y$ layer in the first region; subjecting the respective $Si_{1-x-y}Ge_xC_y$ layers to heat treatment; and forming, a monocrystalline $Si_{1-z-w}Ge_zC_w$ layer ($1>z\geq0$, $1>w\geq0$), which becomes an device formation region, on the first region after the heat treatment and removal of an surface oxide film.

BRIEF DESCRIPTION OF THE SEVERAL VIEWS OF THE DRAWING

FIGS. 1A to 1F are cross sectional views showing a manufacturing process of a semiconductor device according to a first embodiment.

FIG. 7 is a graph showing a relationship between an area (A) and a film thickness (t) of an island structure and a relaxation ratio when performing heat treatment to a SiGe island structure.

DETAILED DESCRIPTION OF THE INVENTION

Figure 2A:
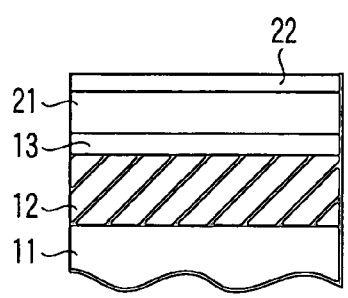
FIGS. 2A and 2B are cross sectional views explaining an oxidation condensation method used in the first embodiment.

Hereinafter, the present invention will be described in detail by way of shown embodiments.

First Embodiment

FIGS. 1A to 1F are cross sectional views showing a manufacturing process of a semiconductor device according to a first embodiment of the present invention. The first and second embodiments described below show only one island region detailed later.

First, as shown in FIG. 1A, an SOI substrate 10 with a Si layer (SOI layer) 13 of a film thickness of 20 nm is formed on an $SiO_2$ film (buried insulating film) 12 on an Si substrate 11. On this SOI substrate 10, an $Si_{0.85}Ge_{0.15}$ layer 21 of a film thickness of 20 nm is grown by an ultrahigh vacuum CVD, a low-pressure CVD, a normal pressure CVD or molecular beam epitaxy. A Si cap layer 22 of a film thickness of 5 nm is grown further thereon.

Then, as shown in FIG. 1B, a transistor active region (source/drain and channel regions) 30 is patterned on a resist 31 by photolithography. Here, for example, the active region (may be an "element formation region" where one or a plurality of elements, e.g., transistors, are formed and, hereinafter, referred to as an "island region") is formed in a rectangular shape. If a size of the active region 30 is smaller than $20\,\mu m^2$, it is lattice-relaxed nearly completely after heat treatment. Since the size of the active region is roughly larger than a horizontal size by about 1% after the lattice relaxation, it is necessary to secure the room for this expansion for the pattern transferred in photolithography beforehand at intervals with the adjacent active region. In an actual LSI, the pattern of 10 $\mu m$ or less is most in the width of the active region. The active region having a width of 10 $\mu m$ expands 50 nm to both sides thereof. Therefore, it is necessary to secure the interval of 100 nm or more between the adjacent active regions in the transferred pattern.

Then, as shown in FIG. 1C, ions of Ge, Si, C, B, $BF_2$, As or the like are implanted via the patterned resist 31 as a mask to make the outside of the transistor active region amorphous. That is, an amorphous SiGe layer is formed by ion implantation. As an ion type to be implanted, Ge ions, C ion, or Si ions, which have no influence on an impurity doping profile, are preferred.

Figure 2B:
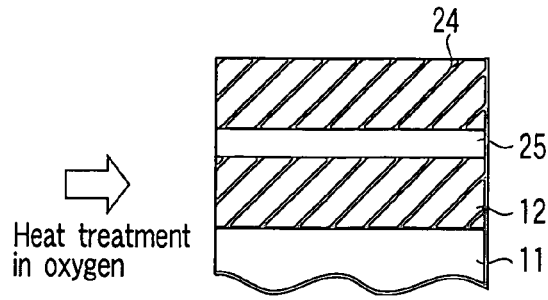

Then, thermal oxidation in an atmosphere including oxygen is carried out at a temperature of 1000° C. or higher to make a film thin until the SiGe layer on the buried oxide film 12 becomes 10 nm in film thickness. This oxidation treatment is called an oxidation condensation method. When dry oxidation is carried out at a temperature of 1000° C. or higher in a state shown in FIG. 2A, a surface of the SiGe layer 21 is oxidized to form an oxide film 24 as shown in FIG. 2B. Then, the Ge is removed from the oxide film 24. Ge is accumulated in the remaining SiGe to form a high Ge composition SiGe film 25. In this heat treatment, an interface between the Si layer 13 and the SiGe layer 21 is lost because of interdiffusion of Ge and Si.

Thus, as shown in FIG. 1D, a lattice-relaxed SiGe layer 25 of a uniform composition (x=0.3) is formed on the buried oxide film 12. An oxidation temperature is preferably set high within a range where the SiGe active region is not melted completely. It is because as the temperature is higher, slipping on an interface between the buried oxide film 12 and the SiGe layer 25 is promoted more to increase a relaxation rate. Specifically, a preferred temperature is from 1150° C. to 1250° C. The oxidation temperature may be gradually lowered as the Ge composition is increased in the oxidation condensation.

A Ge concentration of the SiGe amorphous layer 23 around the SiGe layer 25 becomes high similarly by the oxidation condensation method to form a high Ge concentration polycrystalline SiGe layer 26. Thus, since a region around the SiGe island 25 as the island region is amorphous or polycrystal, the SiGe layer 25 can expand the lattice in the substrate surface via grain boundary slip in the peripheral region. As a result, lattice strain in the SiGe layer 25 can be relaxed sufficiently.

Then, as shown in FIG. 1E, after the removal of the oxide layer 24 from the surface, a strained Si layer 41 is grown with epitaxial growth on the SiGe layer 25. At this time, a polycrystalline Si layer 42 is formed on the amorphous SiGe layer 26.

Then, as shown in FIG. 1F, a circuit is manufactured by conventional CMOS process. That is, a gate electrode 52 is formed on a gate oxide film 51, and a sidewall insulating film 53 is formed. By using these as masks, ion implantation is carried out to form source and drain diffusion layers, whereby a MOSFET is manufactured.

The oxidation process is carried out after the ion implantation process in the first embodiment. Oppositely, the ion implantation process is carried out after the oxidation process, and then the heat treatment may be carried out to relax the lattice of SiGe layer 25. FIG. 7 shows the relationship between the heating time and the relaxation rate in this case. From FIG. 7, for instance, when the SiGe film thickness is 5 nm, and the active region is a rectangle region of 2 $\mu$m×5 $\mu$m (i.e., area A=10 $\mu$m$^2$), the relaxation rate of 90% or more can be obtained after the heat treatment of 1150° C. and 15 hours.

Only a single MOSFET is shown in FIGS. 1A to 1F. However, a CMOS structure can be obtained by forming pluralities of n and p type MOFSETs on the same strained Si layer.

As described above, according to the first embodiment, the peripheral region of the island region which becomes an element formation region of the SiGe layer 21 on the buried oxide film 12 is made amorphous, and then oxidized by the oxidation condensation method. Accordingly, the high Ge composition SiGe layer 25 can be formed. In addition, the SiGe layer 25 can be lattice-relaxed sufficiently. That is, the sufficiently lattice-relaxed SiGe buffer layer 25 of a low dislocation density can be formed on the buried oxide layer 12. Thus, the strained Si layer 41 formed on the SiGe layer 25 can be sufficiently strained. As a result, it is possible to manufacture a high-speed and low power consumption CMOS device.

Without using the oxidation condensation method, a lattice-relaxed SiGe layer can be obtained only by heat treatment after deposition of a surface protective film, such as a CVD-SiO$_2$ layer. In this case, an effect of increasing the Ge composition cannot be obtained. However, if no large Ge composition is required, or if a high Ge composition SiGe film can be grown from the beginning, only heat treatment may be carried out.

A principle of the present invention will be explained referring to FIG. 3A to FIG. 4.

Figure 3A:
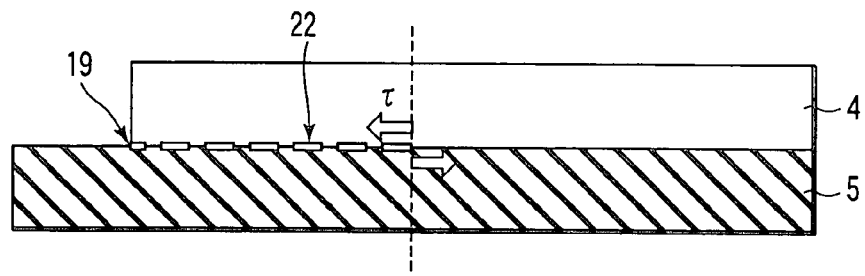
FIGS. 3A and 3B are a cross sectional view of a lattice relaxed SiGe layer according to an embodiment of this invention and a diagram for explaining stress in the lattice relaxed SiGe layer.
Figure 3B:
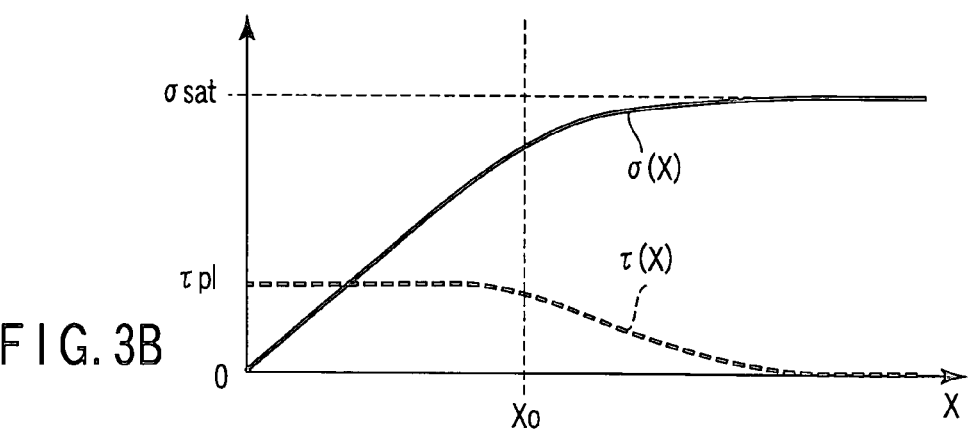

FIGS. 3A and 3B are a cross sectional view of a lattice relaxed SiGe layer which is applied to an integrated circuit device according to an embodiment of this invention and a diagram for explaining stress in the lattice relaxed SiGe layer. In FIGS. 3A and 3B, the influence given by oxide layers formed on the upper portion and side surfaces of a SiGe layer 4 is assumed to be neglected. Since it is known that stress is not accumulated on a flat SiO$_2$/Si interface on which oxidation proceeds, the above assumption is considered adequate. Further, it is assumed that lattice displacement occurs only in an X direction in FIGS. 3A and 3B. In addition, it is assumed that no dislocation occurs in the internal portion of the SiGe layer 4.

If the Ge composition of the SiGe layer 4 increases, stress occurs in the internal portion of the SiGe layer 4. At this time, shear stress $\tau(x)$ at the interface between the insulation layer 5 and the SiGe layer 4 varies in the layer as shown by broken lines in FIG. 3B. As shown by the broken lines in FIG. 3B, shear stress in a portion near the end portion 19 of the SiGe layer 4 (that is, a periphery of a slip plane 22 which is the contact surface between the SiGe layer 4 and the insulation layer 5) becomes approximately constant at a value of shear stress (share flow stress) which is caused when a slip starts to occur on the interface between the SiGe layer 4 and the insulation layer 5. When the slip terminates in a position which is inwardly separated from (in a direction apart from) the end portion 19 by X$_0$, the shear stress $\tau(x)$ gradually decreases and becomes zero.

The axial stress $\sigma(x)$ in the SiGe layer 4 can be obtained by integrating the shear stress $\tau(x)$ by a distance x from the end portion 19. Therefore, the axial stress $\sigma(x)$ gradually becomes larger with an increase in the distance from the end portion 19 and reaches a saturated value σsat in the internal portion (in position sufficiently separated from the end portion 19) of the SiGe layer 4. That is, the SiGe layer 4 is completely lattice-relaxed in a portion near the end portion 19 and the degree of relaxation is more reduced in a portion which is separated from the end portion 19 (in position sufficiently separated from the end portion 19) and closer to the internal portion. If the saturated value σsat corresponds to the internal stress of the SiGe layer 4 when the lattice relaxation is not made at all, that is, when the lattice constant is kept unchanged before and after oxidation.

Considering the relaxation mechanism, the embodiment of this invention is made to have the feature that the thermal oxidation is performed in a condition that the SiGe layer is previously formed into, for example, a plurality of islands, which are surrounded by amorphous or polycrystalline peripheral region, on the insulation layer. That is, it has the feature that the thermal oxidation is performed in a condition that the end portion is formed around the SiGe layer. In this case, the end portion indicates a boundary portion between a layer in which the SiGe layer is continuously formed and the amorphous and polycrystalline peripheral region. The slip on the interface is caused between the SiGe layer and the underlying insulation layer from the end portion of the SiGe layer and release the stress as the Ge composition is increased by thermal oxidation. In this case, spatial room to expand the SiGe layer toward the horizontal direction is secured via grain boundary slip in the peripheral region. The principle is the same as the following embodiments.

The inventor of this application and others made the following experiment to check the distance X$_0$ of a portion in which a slip occurred. First, an Si$_{0.9}$Ge$_{0.1}$ layer 4 with a thickness of 116 nm was formed by epitaxial growth on an SOI substrate 5 with a thickness of 30 nm. Then, the photolithography process and the succeeding chemical dry-etching process were sequentially performed to form the SiGe layer 4 into a circular pattern of island form with the radius R.

Subsequently, the dry oxidation process at 1200° C. was performed until the thickness of the SiGe layer 4 became 77 nm. At this time, the Ge composition ratio of the SiGe layer 4 increased to 15 atomic %. Next, the dependency of internal strain on the radius R was measured based on Raman spectroscopy for a circular pattern of the SiGe layer 4. The measuring position is set at substantially the center of the circular pattern and the laser spot diameter is approximately 1 $\mu$m.

Figure 4:
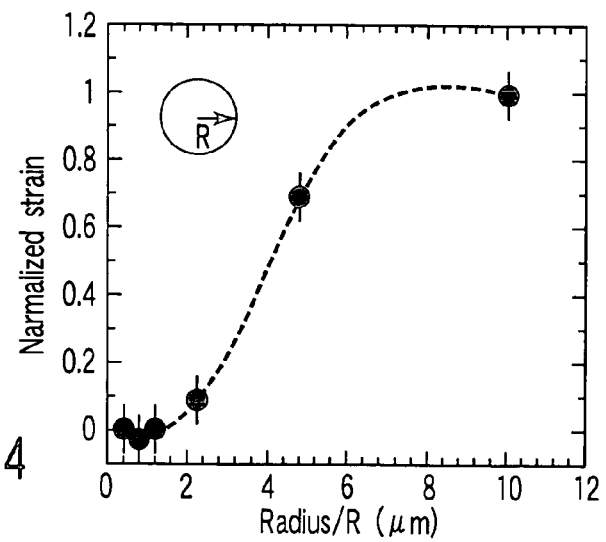
FIG. 4 is a graph showing the dependency of internal strain on the radius R based on Raman spectroscopy for circular islands of SiGe layers.

FIG. 4 shows the result of the measurement.

In FIG. 4, the ordinate indicates the lattice strain after oxidation normalized by the lattice strain in a strained SiGe layer having the Ge composition of 15 atomic % on a Si substrate and the amount thereof is proportional to a shown in FIG. 3B. The abscissa indicates the radius R. In general, the radius corresponds to the distance from the end portion 19.

It is understood from FIG. 4 that the internal strain in a region lying within the distance of 5 $\mu$m from the end portion 19 of the SiGe layer 4 is rapidly decreased. That is, it is understood that a slip occurs between the SiGe layer 4 and the underlying insulation layer 5 in the region lying within the distance of 5 $\mu$m from the end portion 19 so that the SiGe layer 4 can be lattice-relaxed. It is also understood that the lattice relaxation in the above region is caused not by introducing dislocations but by the slip at the interface between the SiGe layer and the buried oxide layer. The threading dislocation density was found to be equal to or lower than $10^4$ cm$^{-2}$. Particularly, it is understood that complete lattice relaxation can be attained in a region lying within the distance of 2 μm from the end portion 19.

From the above results, it is understood that, in the lattice relaxed SiGe layer 4 on the region lying within the distance of 5 μm from the end portion 19 of the lattice relaxed SiGe layer 4 which is formed in an island form, excellent crystallinity of the underlying SiGe substrate is obtained unlike the conventional case. As a result, an extremely flat layer with no dislocation can be attained as the strained Si layer (or strained SiGe layer) 3 formed on the lattice relaxed SiGe layer 4. Therefore, it is only required to form a field effect transistor in which a channel or an active region of the element, that is, a region sandwiched between the source and drain regions exists on the strained Si layer (or strained SiGe layer) 3 which is formed on the surface lying within the distance of 5 μm from the end portion 19 of the lattice relaxed SiGe layer 4. More preferably, a field effect transistor may be formed on a region lying within the distance of 2 μm from the end portion 19. This is because the normalized strain in the SiGe layer 4 is 0.1 or less in the region lying within the distance of 2 μm from the end portion 19 as it is understood from FIG. 4, and the threading dislocation density is lowered since it is substantially completely lattice-relaxed.

Second Embodiment

FIGS. 5A to 5E are cross sectional views showing a manufacturing process of a semiconductor device according to a second embodiment of the present invention. Portions similar to those of FIGS. 1A to 1F are denoted by similar reference numerals, and detailed description thereof will be omitted.

Figure 5A:
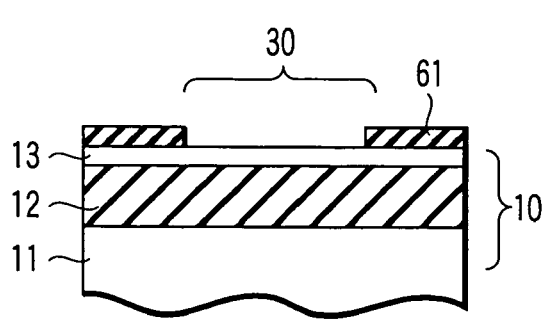
FIGS. 5A to 5E are cross sectional views showing a manufacturing process of a semiconductor device according to a second embodiment.

First, as shown in FIG. 5A, an SOI substrate 10 is prepared, where a Si layer (SOI layer) 13 of a film thickness of 20 nm is formed on an SiO$_2$ film 12 on a Si substrate 11. On this SOI substrate 10, the SiO$_2$ film 61 of a thickness of 5 nm is formed and then a window is opened in a transistor formation region 30. For the same reason as that of the first embodiment, preferably, a size of the window is smaller than 20 μm$^2$.

Figure 5B:
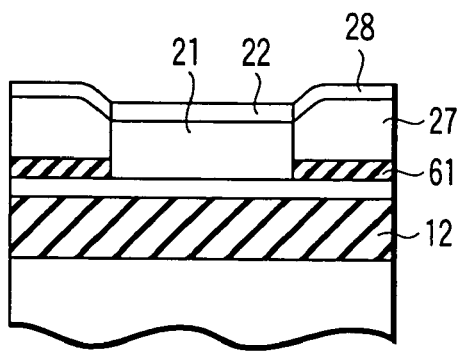

Then, as shown in FIG. 5B, a Si$_{0.85}$Ge$_{0.15}$ layer of a film thickness of 20 nm is grown by an ultrahigh vacuum CVD, a low-pressure CVD, a normal pressure CVD or molecular beam epitaxy. A Si cap layer of a film thickness of 5 nm is grown further thereon. Then, on the window portion, a monocrystalline SiGe layer 21 and an monocrystalline Si layer 22 are epitaxially grown on a Si substrate, and a polycrystalline SiGe layer 27 and a polycrystalline Si layer 28 are formed on the SiO$_2$ film 61.

Figure 5C:
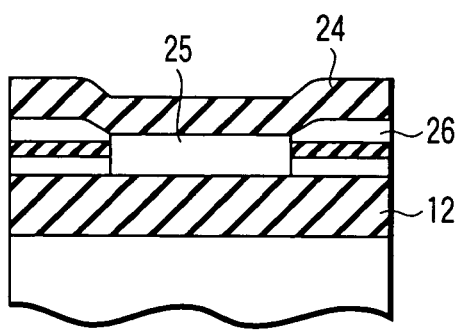

Then, dry oxidation is carried out at a temperature of 1000° C. or higher to make the film thin until the SiGe layer on the buried oxide film 12 becomes 10 nm in film thickness. Thus, as shown in FIG. 5C, a lattice-relaxed SiGe layer 25 of a uniform composition (x=0.3) is formed on the buried oxide film 12. An oxidation temperature is preferably set high within a range where the SiGe active region is not melted completely. It is because as the temperature is higher, slipping on an interface between the buried oxide film 12 and the SiGe layer 25 is promoted more to increase a relaxation rate. Specifically, as in the first embodiment, a preferred temperature is from 1150° C. to 1250° C. The oxidation temperature may be gradually lowered as the Ge composition in the oxidation condensation is increased.

A Ge concentration of a polycrystalline SiGe layer 27 around the SiGe layer 25 becomes high similarly by the oxidation condensation method and then a high Ge concentration SiGe layer 26 is formed. This SiGe layer 26 is still in polycrystalline. Thus, since a region around the SiGe layer 25 as the island region is polycrystalline, the SiGe layer 25 can expand the lattice laterally via grain boundary slip in the peripheral region. As a result, lattice strain in the SiGe layer 25 can be relaxed sufficiently. Additionally, since the SiO$_2$ film 61 is extremely thin, the layer 61 never prevents the lattice relax of the SiGe layer 25.

Figure 5D:
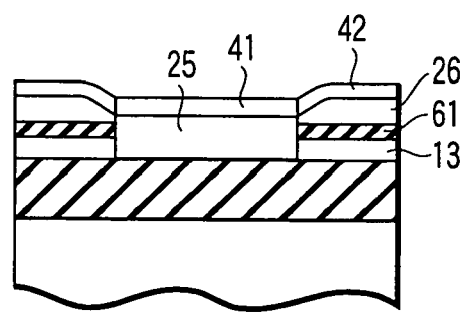

Then, as shown in FIG. 5D, after the removal of the oxide layer 24 from the surface, a strained Si layer 41 is grown with epitaxial growth. At this time, a polycrystalline Si layer 42 is grown on the polycrystalline SiGe layer 26.

Figure 5E:
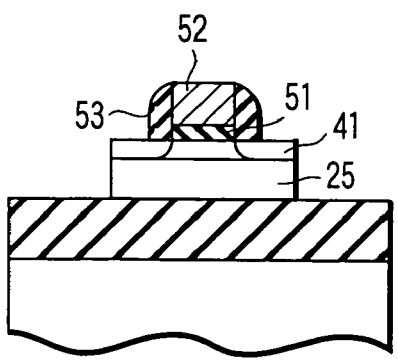

Thereafter, as in first embodiment, as shown in FIG. 5E, a gate electrode 52 is formed through a gate oxide film 51, and a gate lateral insulating film 53 is formed. By using these as masks, ion implantation is carried out to form source and drain diffusion layers, whereby a MOSFET is manufactured.

As described above, according to the second embodiment, the oxide film 61 having the widow on a part is selectively formed on the SOI substrate 10, and the SiGe layer is formed thereon. Accordingly, an SiGe monocrystal island region and its polycrystalline peripheral region ca be formed. Then, as in first embodiment, an oxidation condensation method is carried out in this state to form the high Ge composition SiGe layer 25, and to sufficiently relax the lattice of the SiGe layer 25. Therefore, effects similar to those of the first embodiment can be obtained.

(Modification)

The present invention is not limited to the foregoing embodiments. In the embodiments, SiGe is used for the buffer layer to reduce the lattice. Instead, however, SiGeC can be used. In this case, a degree of freedom for setting strain can be increased by selection of a C composition. That is, as the buffer layer for lattice relaxation, a Si$_{1-x-y}$Ge$_x$C$_y$ layer (1>x>0, 1>y≧0) can be used. The semiconductor layer formed on the buffer layer is not necessarily limited to Si, but Ge or C may be contained. That is, a Si$_{1-z-w}$Ge$_z$C$_w$ layer (1>z≧0, 1>w≧0) can be used.

Additionally, the strain may not be tensile strain as described in the above-mentioned embodiment, but may be compressive strain. In this case, a Ge composition becomes larger than that of the lattice-relaxed buffer layer. Especially, if a Ge composition of a channel layer becomes about 70% or higher, electron and hole mobility higher than that of the tensily strained Si can be obtained.

Figure 6A:
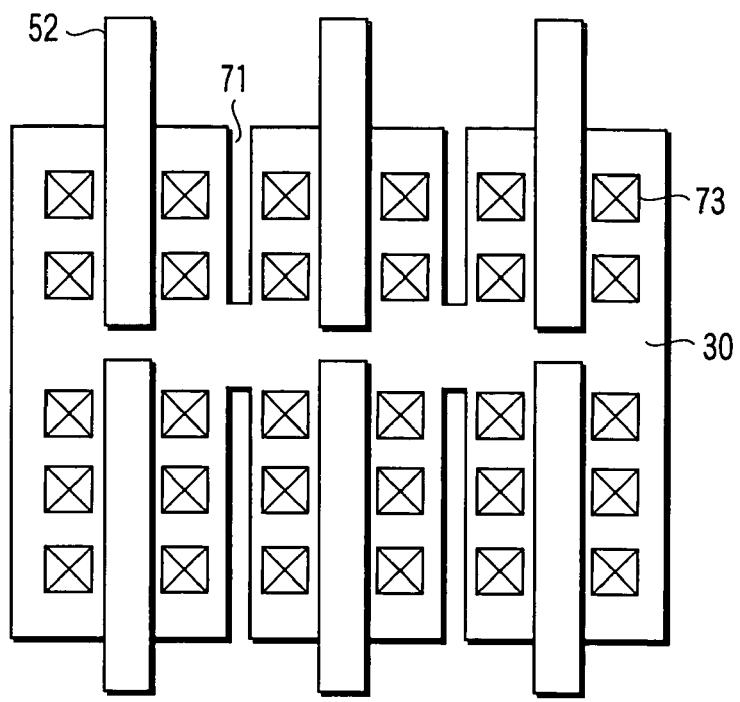
FIGS. 6A and 6B are plan views explaining a modified example of the present invention.
Figure 6B:
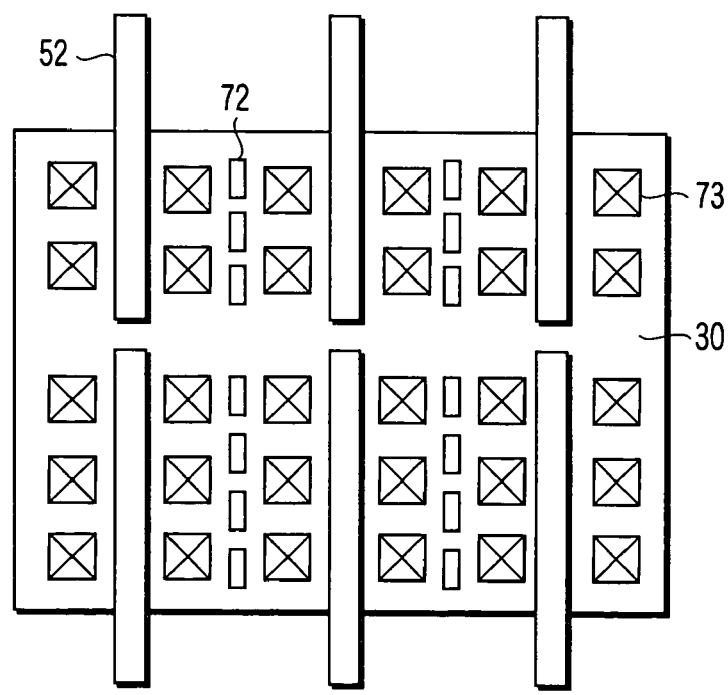

The shape of the island region is not limited to the rectangle, but others such as a polygon, a circle, and an ellipse may be used. The transistor formation region 30 is not necessarily isolated completely, but may be disposed in a peninsular shape. Moreover, a slit 71 may be disposed as shown in FIG. 6A, or a hole 72 may be disposed as shown in FIG. 6B. Source and drain contact holes 73 and gate electrodes 52 are shown in FIGS. 6A and 6B.

A semiconductor device manufacturing method according to a first aspect of the present invention is characterized by comprising: forming an island region including a monocrystalline Si$_{1-x-y}$Ge$_x$C$_y$ layer (1>x>0, 1>y≧0) and a peripheral region including an amorphous or polycrystalline Si$_{1-x-y}$Ge$_x$C$_y$ layer which surrounds the island region on a monocrystalline Si layer on an insulating film; subjecting the respective Si$_{1-x-y}$Ge$_x$C$_y$ layers to heat treatment; and forming a monocrystalline $Si_{1-z-w}Ge_zC_w$ layer ($1>z\geq0$, $1>w\geq0$), which becomes an device formation region, on the island region after the heat treatment and removal of a surface oxide film. Here, it is preferable that the forming the monocrystalline island region including the $Si_{1-x-y}Ge_xC_y$ and the amorphous or polycrystalline peripheral region includes forming an oxide film on the monocrystalline Si layer on the insulating film excluding a portion corresponding to the element formation region, and then forming an $Si_{1-x-y}Ge_xC_y$ monocrystalline layer on the monocrystalline Si layer and an $Si_{1-x-y}Ge_xC_y$ polycrystalline layer on the oxide film, respectively.

A semiconductor device manufacturing method according to a second aspect of the present invention is characterized by comprising: forming a monocrystalline $Si_{1-x-y}Ge_xC_y$ layer ($1>x>0$, $1>y\geq0$) on a monocrystalline Si layer on an insulating film; forming an island-shaped mask layer on the $Si_{1-x-y}Ge_xC_y$ layer; making a peripheral region amorphous by ion implantation excluding an island region of the $Si_{1-x-y}Ge_xC_y$ layer covered with the island-shaped mask layer; subjecting the $Si_{1-x-y}Ge_xC_y$ layer to heat treatment; and forming a monocrystalline $Si_{1-z-w}Ge_zC_w$ layer ($1>z\geq0$, $1>w\geq0$), which becomes an device formation region, on the island region of the $Si_{1-x-y}Ge_xC_y$ layer after the heat treatment and removal of a surface oxide film.

In the first and second aspects, the following modes are preferable. The following modes may be independently applied, or in combination.

(1) In the process of heat treatment, in place of oxidizing a part of the surface by heating, the heat treatment is carried out after the surface is covered with a protective film (Si oxide film, Si nitride film or the like).

(2) Ion species for the implantation are one of a Si ion, a C ion or a Ge ion or combination thereof.

(3) The heat treatment is carried out in an atmosphere containing oxygen.

(4) The heat treatment is carried out in an atmosphere containing oxygen, and thereafter the heat treatment is carried out in an atmosphere without oxygen.

A semiconductor device manufacturing method according to a third aspect of the present invention is characterized by comprising: forming a first region including a monocrystalline $Si_{1-x-y}Ge_xC_y$ layer ($1>x>0$, $1>y\geq0$) on a monocrystalline Si layer on an insulating film and a second region including a slit or hole-shaped amorphous or polycrystalline $Si_{1-x-y}Ge_xC_y$ layer in the first region; subjecting the respective $Si_{1-x-y}Ge_xC_y$ layers to heat treatment; and forming, a monocrystalline $Si_{1-z-w}Ge_zC_w$ layer ($1>z\geq0$, $1>w\geq0$), which becomes an device formation region, on the first region after the heat treatment and removal of an surface oxide film.

According to the third aspect, the following modes are preferable. The following modes may be independently applied or in combination.

(1) A distance between the slits or between the holes is set within 10 $\mu$m.

(2) A width of the slit or the hole is at least 0.1 $\mu$m.

(3) The hole has a long and narrow shape.

In order to relax the lattice of the strained SiGe layer lattice-aligned with the Si substrate without any dislocation, slipping must occur on the interface with the substrate buried oxide film to expand the lattice in the horizontal direction. Thus, the slipping on the interface between the SiGe layer and the buried oxide film must be promoted, and special room is necessary for horizontal expansion.

According to the embodiment of the present invention, to satisfy the above two conditions, an island-shaped SiGe layer is formed on the Si crystal layer (SOI) on the insulating film, a peripheral region adjacent to this island region is made an amorphous or polycrystalline SiGe layer, and heat treatment is carried out in this state. If the heat treatment is carried out in an atmosphere without oxygen, a Si oxide film or a Si nitride film is deposited before the heat treatment to prevent surface roughness. At this time, by slip of a grain boundary present at a high density in the surrounding SiGe layer, the island-shaped SiGe layer can be expanded laterally. Since a contact area between the island and the insulating film becomes smaller, slip at the interface becomes easier as an area of the island region becomes smaller. Therefore, relaxation occurs more easily as the area of the island region is smaller. If it is smaller than a certain critical value, the lattice can be relaxed completely without any dislocation.

At this time, because of interdiffusion between Si and Ge atoms, the interface between the Si layer and the SiGe layer is lost, and the Ge composition is made uniform. Further, by introducing oxygen during the heat treatment, and carrying out the oxidation condensation described above in the background art, it is possible to obtain a lattice-relaxed SiGe layer higher in Ge composition and thinner compared with those before the oxidation. Then, by forming an Si layer on the island region after the removal of the surface oxide film, it is possible to form a semiconductor layer which has sufficient lattice strain.

Thus, according to the embodiment of the present invention, it is possible to form a lattice-relaxed SiGe thin film on the insulating film, which is suited for strained Si—CMOS manufacturing. Moreover, since impurity doping or the like to the underlying insulating film needs not be executed, no inconveniences occur for CMOS manufacturing. Therefore, the invention can contribute to realization of a high-speed and lower power consumption CMOS device.

The phenomenon of the crystal lattice strain relaxation in the island region by making amorphous or polycrystalline the peripheral region adjacent to the island region is not limited in the SiGe but occurs in SiGeC. Moreover, SiGe or SiGeC can be used in place of Si for the device formation layer.

Various changes and modifications can be made without departing from the scope of the present invention.

As described above, by making amorphous or polycrystalline the peripheral region adjacent to the island region with respect to the $Si_{1-x-y}Ge_xC_y$ layer ($1>x>0$, $1>y\geq0$) formed on the SOI layer, the crystal lattice strain of the island region can be sufficiently reduced. As a result, the invention can contribute to realization of a high-speed, low power consumption and highly reliable CMOS device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device manufacturing method comprising:
    forming an island region including a monocrystalline $Si_{1-x-y}Ge_xC_y$ layer ($1>x>0$, $1>y\geq0$) and a peripheral region including an amorphous layer;
    subjecting the $Si_{1-x-y}Ge_xC_y$ layer and the amorphous layer to heat treatment; and forming a monocrystalline $Si_{1-z-w}Ge_zC_w$ layer ($1>z\geq0$, $1>w\geq0$), which becomes a device formation region, on the island region after the heat treatment and removal of a surface oxide film.

2. The method according to claim 1, wherein the forming the monocrystalline island region including the $Si_{1-x-y}Ge_xC_y$ and the amorphous peripheral region includes forming an oxide film on the monocrystalline Si layer on the insulating film excluding a portion corresponding to the element formation region, and then forming an $Si_{1-x-y}Ge_xC_y$ monocrystalline layer on the monocrystalline Si layer and $Si_{1-x-y}Ge_xC_y$ polycrystalline layer on the oxide film, respectively.

3. The method according to claim 1, wherein the heat treatment is carried out in an atmosphere containing oxygen.

4. The method according to claim 1, wherein the heat treatment is carried out in an atmosphere containing oxygen, and thereafter the heat treatment is carried out in an atmosphere without oxygen.

5. The method according to claim 1, wherein a temperature of the heat treatment is 1000° C. or more.

6. The method according to claim 1, wherein a temperature of the heat treatment is from 1150 to 1250° C.

7. The method according to claim 1, wherein a size of the island region is smaller than 20 $\mu m^2$.

8. The method according to claim 1, wherein a distance between the island regions is at least 0.1 $\mu m$.

9. The method according to claim 1, wherein the forming the island region and the peripheral region includes:

forming a monocrystalline $Si_{1-x-y}Ge_xC_y$ layer ($1>x>0$, $1>y\geq0$) on a monocrystalline Si layer on an insulating film;

forming an island-shaped mask layer on the $Si_{1-x-y}Ge_xC_y$ layer; and making a peripheral region amorphous by ion implantation excluding an island region of the $Si_{1-x-y}Ge_xC_y$ layer covered with the island-shaped mask layer.

10. The method according to claim 9, wherein, ion species for the implantation are one of a Si ion, a C ion or a Ge ion or combination thereof.

11. The method according to claim 9, wherein the heat treatment is carried out in an atmosphere containing oxygen.

12. The method according to claim 9, wherein the heat treatment is carried out in an atmosphere containing oxygen, and thereafter the heat treatment is carried out in an atmosphere without oxygen.

13. The method according to claim 9, wherein a temperature of the heat treatment is 1000° C. or more.

14. The method according to claim 9, wherein a temperature of the heat treatment is from 1150 to 1250° C.

15. The method according to claim 9, wherein a size of the island region is smaller than 20 $\mu m^2$.

16. The method according to claim 9, wherein a distance between the island regions is at least 0.1 $\mu m$.

17. The method according to claim 1, wherein the island region includes a first region including a monocrystalline $Si_{1-x-y}Ge_xC_y$ layer ($1>x>0$, $1>y\geq0$) on a monocrystalline Si layer on an insulating film and a second region including a slit or hole-shaped amorphous layer in the first region.

18. The method according to claim 17, wherein a distance between the slits or between the holes is set within 10 $\mu m$.

19. The method according to claim 17, wherein a width of the slit or the hole is at least 0.1 $\mu m$.

20. The method according to claim 17, wherein the hole has a long and narrow shape.

21. The method according to claim 1, wherein the forming the island region and the peripheral region includes forming a plurality of island regions; and each of plurality of island regions has only one active region.

22. A semiconductor device manufacturing method comprising: forming an island region including a monocrystalline $Si_{1-x-y}Ge_xC_y$ layer ($1>x>0$, $1>y\geq0$) and a peripheral region including a polycrystalline $Si_{1-x-y}Ge_xC_y$ layer, which surrounds the island region;

subjecting the $Si_{1-x-y}Ge_xC_y$ layers to heat treatment; and forming a monocrystalline $Si_{1-z-w}Ge_zC_w$ layer ($1>z\geq0.1>w\geq0$), which becomes a device formation region, on the island region after the heat treatment and removal of a surface oxide film.

23. The method according to claim 22, wherein the forming the monocrystalline island region and the polycrystalline peripheral region includes forming an oxide film on the monocrystalline Si layer on the insulating film excluding a portion corresponding to the element formation region, and then forming an $Si_{1-x-y}Ge_xC_y$ monocrystalline layer on the monocrystalline Si layer and an $Si_{1-x-y}Ge_xC_y$ polycrystalline layer on the oxide film, respectively.

24. The method according to claim 21, wherein the island region includes a first region including a monocrystalline $Si_{1-x-y}Ge_xC_y$ layer ($1>x>0$, $1>y\geq0$) on a monocrystalline Si layer on an insulating film and a second region including a slit or hole-shaped polycrystalline $Si_{1-x-y}Ge_xC_y$ layer in the first region.

* * * * *

UNITED STATES PATENT AND TRADEMARK OFFICE
CERTIFICATE OF CORRECTION

PATENT NO. : 7,005,676 B2
DATED : February 28, 2006
INVENTOR(S) : Tezuka et al.

It is certified that error appears in the above-identified patent and that said Letters Patent is hereby corrected as shown below:

Column 12,
Line 30, change "($1 > z \geq 0.1 > w \geq 0$)," to -- ($1 > z \geq 0, 1 > w \geq 0$), --.

Signed and Sealed this

Twenty-third Day of May, 2006

JON W. DUDAS
*Director of the United States Patent and Trademark Office*